(12) United States Patent
Chen et al.

(10) Patent No.: US 12,125,769 B2
(45) Date of Patent: Oct. 22, 2024

(54) PACKAGE STRUCTURE AND METHOD OF FABRICATING THE SAME

(71) Applicant: Taiwan Semiconductor Manufacturing Company, Ltd., Hsinchu (TW)

(72) Inventors: Hsien-Wei Chen, Hsinchu (TW); Jie Chen, New Taipei (TW); Ming-Fa Chen, Taichung (TW); Sung-Feng Yeh, Taipei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 120 days.

(21) Appl. No.: 17/853,953

(22) Filed: Jun. 30, 2022

(65) Prior Publication Data

US 2022/0336329 A1 Oct. 20, 2022

Related U.S. Application Data

(63) Continuation of application No. 16/856,044, filed on Apr. 23, 2020, now Pat. No. 11,417,587.

(60) Provisional application No. 62/928,347, filed on Oct. 30, 2019.

(51) Int. Cl.
| | |
|---|---|
| H01L 23/48 | (2006.01) |
| H01L 21/48 | (2006.01) |
| H01L 21/56 | (2006.01) |
| H01L 23/31 | (2006.01) |

(52) U.S. Cl.
CPC .......... *H01L 23/481* (2013.01); *H01L 21/486* (2013.01); *H01L 21/56* (2013.01); *H01L 23/3114* (2013.01); *H01L 23/3135* (2013.01)

(58) Field of Classification Search
None
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |

(Continued)

*Primary Examiner* — Jay C Chang
(74) *Attorney, Agent, or Firm* — JCIPRNET

(57) ABSTRACT

A package structure including a first semiconductor die, a first insulating encapsulation, a bonding enhancement film, a second semiconductor die and a second insulating encapsulation is provided. The first insulating encapsulation laterally encapsulates a first portion of the first semiconductor die. The bonding enhancement film is disposed on a top surface of the first insulating encapsulation and laterally encapsulates a second portion of the first semiconductor die, wherein a top surface of the bonding enhancement film is substantially leveled with a top surface of the semiconductor die. The second semiconductor die is disposed on and bonded to the first semiconductor die and the bonding enhancement film. The second insulating encapsulation laterally encapsulates the second semiconductor die.

20 Claims, 14 Drawing Sheets

(56) References Cited

U.S. PATENT DOCUMENTS

| | | | |
|---|---|---|---|
| 2015/0179625 A1* | 6/2015 | Park | H01L 23/49827 |
| | | | 438/108 |
| 2015/0318266 A1* | 11/2015 | Jang | H01L 23/528 |
| | | | 257/720 |
| 2018/0082933 A1* | 3/2018 | Ko | H01L 21/568 |
| 2018/0145061 A1* | 5/2018 | Jeong | H01L 23/5383 |

* cited by examiner

PACKAGE STRUCTURE AND METHOD OF FABRICATING THE SAME

CROSS-REFERENCE TO RELATED APPLICATION

This application is a continuation application of U.S. application Ser. No. 16/856,044, filed on Apr. 23, 2020, now allowed. The prior U.S. application Ser. No. 16/856,044 claims the priority benefit of U.S. provisional application Ser. No. 62/928,347, filed on Oct. 30, 2019. The entirety of the above-mentioned patent applications is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies. Currently, System-on-Integrated-Circuit (SoIC) components are becoming increasingly popular for their multi-functions and compactness. However, there are challenges related to the SoIC components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
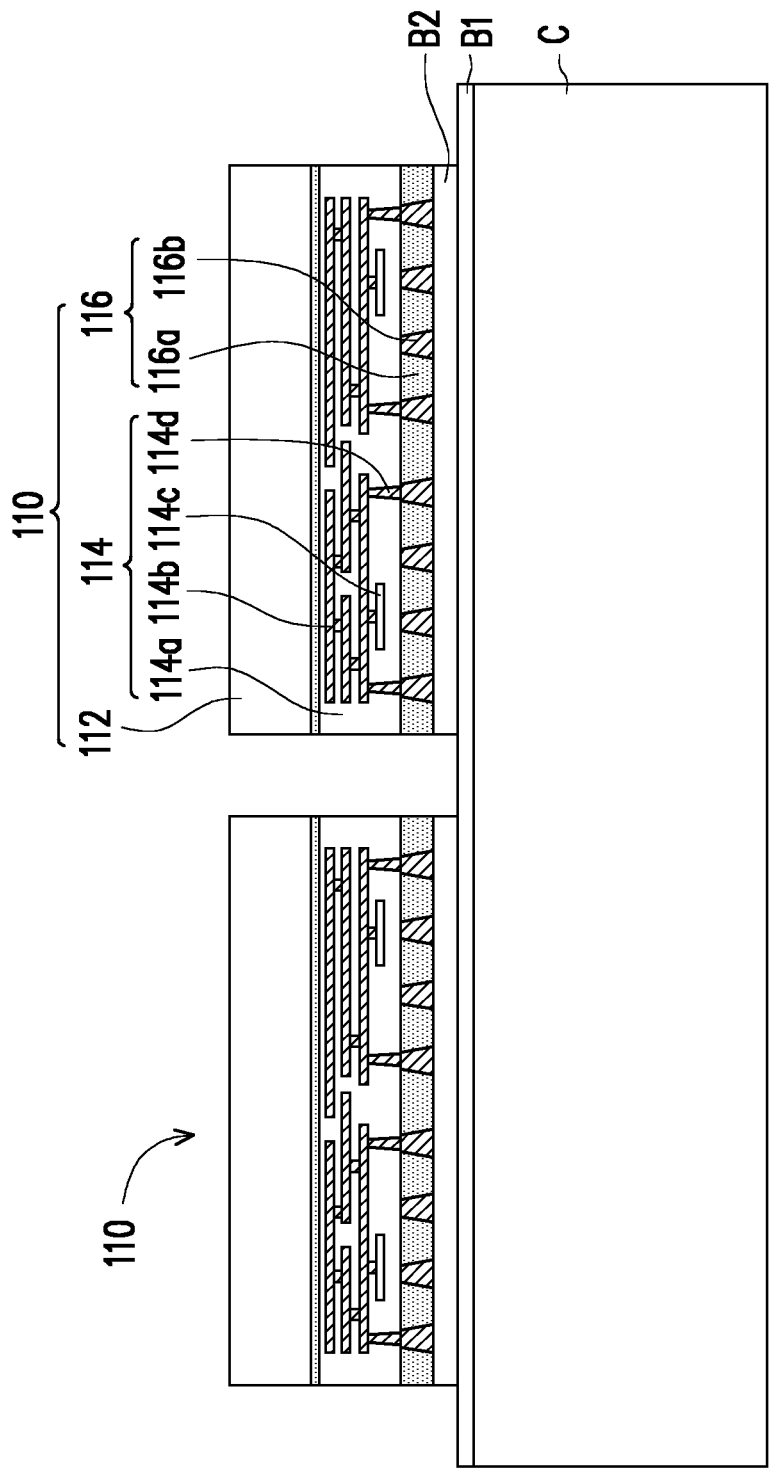
FIG. 1 through FIG. 9 are cross-sectional views schematically illustrating a process flow for fabricating an integrated fanout package structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 through FIG. 9 are cross-sectional views schematically illustrating a process flow for fabricating an integrated fanout package structure in accordance with some embodiments of the present disclosure.

Referring to FIG. 1, a carrier C and bottom tier semiconductor dies 110 are provided. The carrier C may be a wafer form carrier (e.g., a glass carrier) and include a bonding layer B1 formed thereon, and each of the bottom tier semiconductor dies 110 may include a bonding layer B2 formed thereon. The bottom tier semiconductor dies 110 may be bonded to the carrier C through the bonding layers B1 and B2. A chip-to-wafer fusion bonding process may be performed to bond the bottom tier semiconductor dies 110 with the carrier C by the bonding layers B1 and B2. The material of the bonding layers B1 and B2 may include silicon dioxide, silicon oxynitride, and so on.

The bottom tier semiconductor dies 110 may each include a semiconductor substrate 112, an interconnect structure 114 disposed on the semiconductor substrate 112 and a bonding structure 116 disposed on the interconnect structure 114. The semiconductor substrate 112 may be a silicon substrate including active components (e.g., transistors or the like) and passive components (e.g., resistors, capacitors, inductors, or the like) formed therein. The active components and passive components are formed in the semiconductor substrate 112 through front end of line (FEOL) fabrication processes of the bottom tier semiconductor dies 110. The interconnect structure 114 may include dielectric layers 114a, interconnect wirings (e.g., copper interconnect wirings) 114b, conductive pads 114c (e.g., aluminum pads) and conductive vias 114d, wherein the interconnect wirings 114b, the conductive pads 114c and the conductive vias 114d are embedded in the dielectric layers 114a, and the interconnect wirings 114b, the conductive pads 114c and the conductive vias 114d are electrically connected to the active components and/or the passive components in the semiconductor substrate 112. The interconnect structure 114 is formed through back end of line (BEOL) fabrication processes of the bottom tier semiconductor dies 110. The interconnect structure 114 may further include a passivation layer (not shown), wherein the conductive pads 114c are partially covered by the passivation layer. In other words, the conductive pads 114c are partially revealed from the openings defined in the passivation layer. The passivation layer may be a silicon oxide layer, a silicon nitride layer, a silicon oxy-nitride layer, or a dielectric layer formed by other suitable inorganic dielectric materials. The interconnect structure 114 may further include a post-passivation layer (not shown) formed over the passivation layer, wherein the post-passivation layer covers the passivation layer and the conductive pads 114c, the post-passivation layer includes a plurality of contact openings, and the conductive pads 114c are partially revealed from the contact openings defined in the post passivation layer. The post-passivation layer may be a polyimide (PI) layer, a PBO layer, or a dielectric layer formed by other suitable organic dielectric materials. In some alternative embodiments, the post-passivation layer is omitted.

The bonding structure 116 disposed on the interconnect structure 114 may include a first dielectric bonding film 116a and first bonding conductors 116b embedded in the first dielectric bonding film 116a, wherein the first dielectric bonding film 116a covers the interconnect structure 114, and the first bonding conductors 116b are electrically connected to the interconnect wirings 114b through the conductive vias 114d. The material of the first dielectric bonding film 116a may include silicon oxide, silicon oxynitride or other suitable dielectric materials, and the material of the first bonding conductors 116b may include copper or other suitable metallic materials. The material of the insulating encapsulation 120 may be different from that of the first dielectric bonding film 116a.

Figure 2:
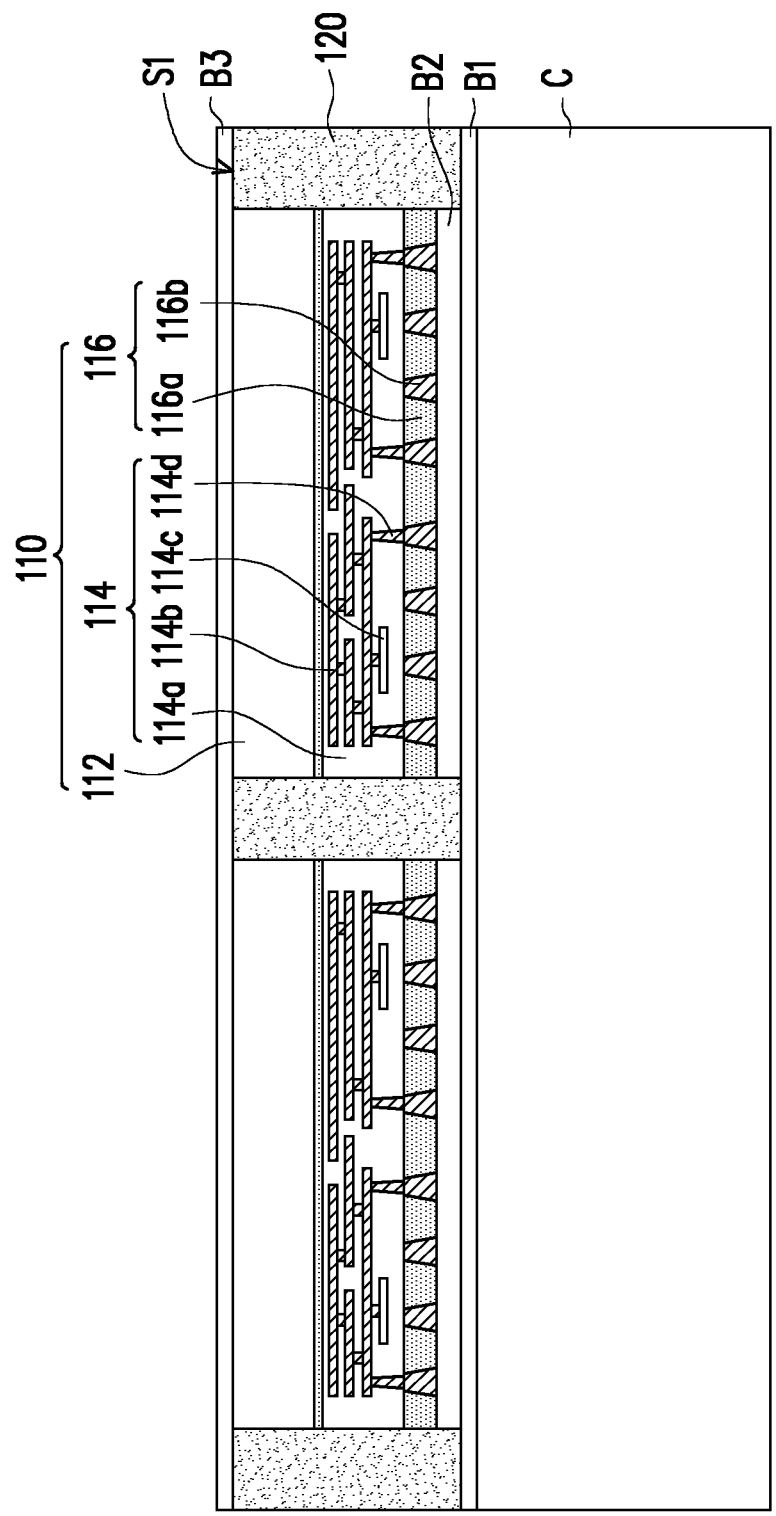

Referring to FIG. 2, an insulating encapsulation 120 is formed over the carrier C to laterally encapsulate the bottom tier semiconductor dies 110. The insulating encapsulation 120 may be formed by an over-molding process or a deposition process followed by a removal process. In some embodiments, an insulating material such as tetraethoxysilane (TEOS) formed oxide is formed on the bonding layer B1 to cover back surfaces and sidewalls of the bottom tier semiconductor dies 110 through a chemical vapor deposition (CVD) process, and a chemical mechanical polishing (CMP) process or other suitable removal process is then performed to remove portions of the TEOS formed oxide until the back surfaces of the bottom tier semiconductor dies 110 are revealed. In some alternative embodiments, an insulating material such as epoxy resin is formed on the bonding layer B1 to cover the back surfaces and sidewalls of the bottom tier semiconductor dies 110 through an over-molding process, and a chemical mechanical polishing (CMP) process or other suitable removal process is then performed to remove portions of the epoxy resin until the back surfaces of the bottom tier semiconductor dies are revealed. After performing the above-mentioned removal process, the insulating encapsulation 120 is formed to fill gaps between the bottom tier semiconductor dies 110, and a surface S1 of the insulating encapsulation 120 is substantially leveled with the back surfaces of the bottom tier semiconductor dies 110.

After forming the insulating encapsulation 120, a bonding layer B3 may be formed to cover the surface S1 of the insulating encapsulation 120 and the back surfaces of the bottom tier semiconductor dies 110. In some embodiments, the bonding layer B3 is a fusion bonding layer formed by a deposition process, and the material of the bonding layer B3 includes silicon dioxide, silicon oxynitride, and so on.

Figure 3:
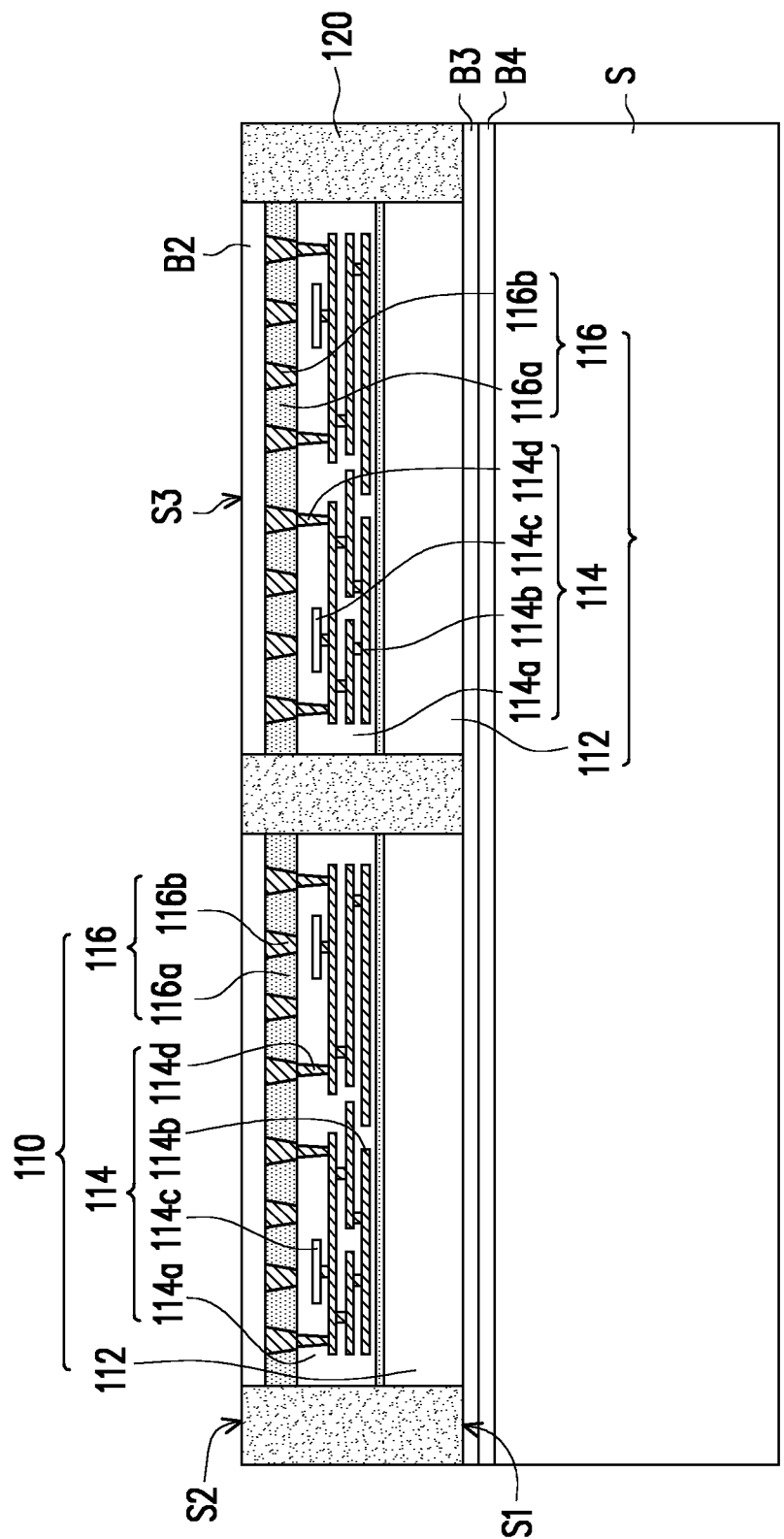

Referring to FIG. 2 and FIG. 3, the resulted structure illustrated in FIG. 2 is transfer bonded to a support substrate S having a bonding layer B4 formed thereon. The resulted structure illustrated in FIG. 2 may be flipped upside down to bond with the bonding layer B4 carried by the support substrate S, wherein the bonding layer B3 is bonded with the bonding layer B4. A wafer-to-wafer fusion bonding process may be performed to bond the bonding layer B3 and the bonding layer B4. The material of the bonding layer B4 may be the same as that of the bonding layer B3. For example, the material of the bonding layer B4 includes silicon dioxide, silicon oxynitride, and so on.

After bonding the bottom tier semiconductor dies 110 laterally encapsulated by the insulating encapsulation 120 with the support substrate S, the carrier C and the bonding layer B1 are de-bonded from a surface S2 of the insulating encapsulation 120 and top surfaces S3 of the bonding layers B2 such that the surface S2 of the insulating encapsulation 120 and the top surfaces S3 of the bonding layers B2 are revealed. As illustrated in FIG. 3, the surface S2 of the insulating encapsulation 120 is opposite to the surface S1 of the insulating encapsulation 120, and the surface S2 of the insulating encapsulation 120 is substantially leveled with the top surfaces S3 of the bonding layers B2.

Figure 4:
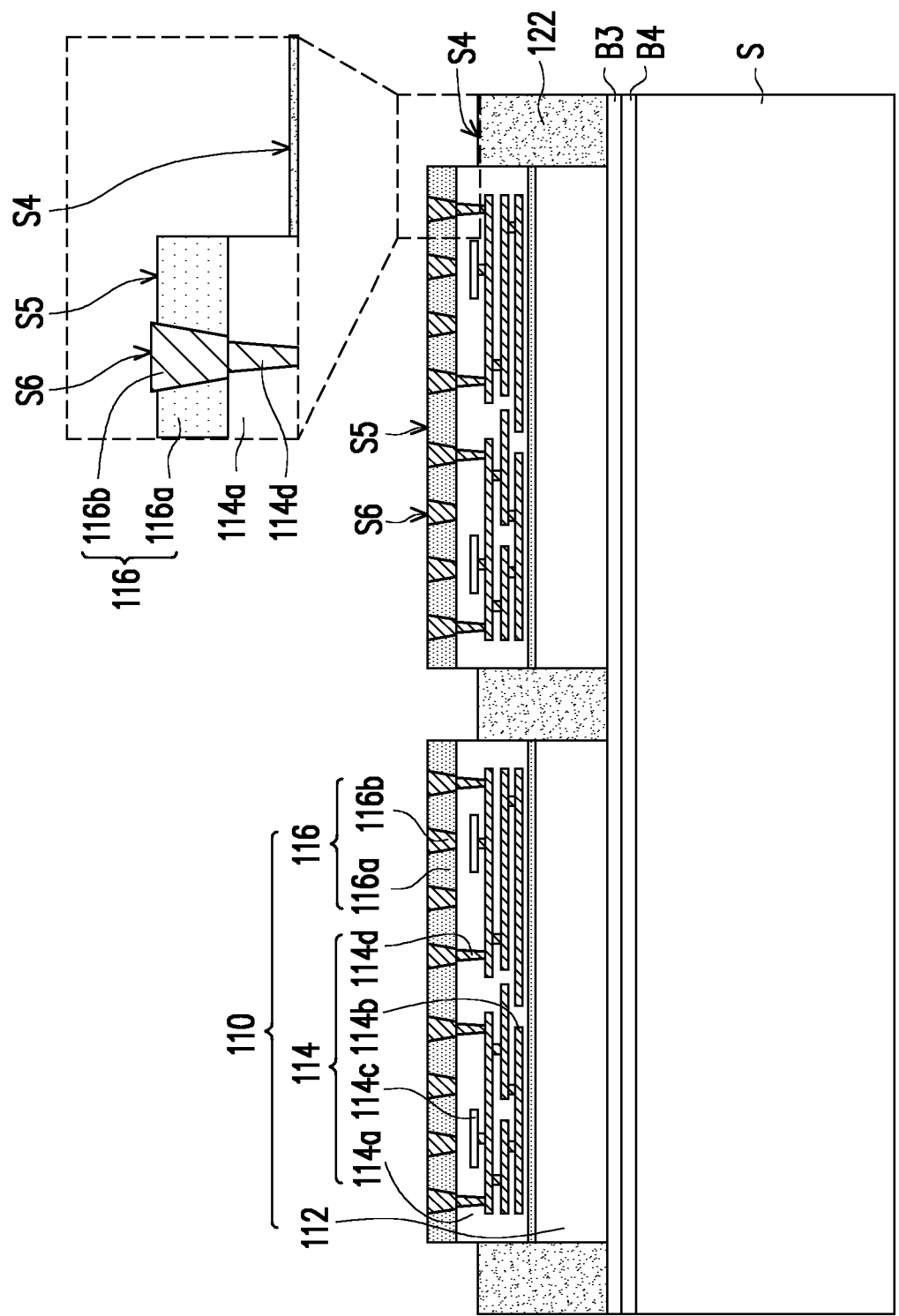

Referring to FIG. 3 and FIG. 4, a thinning process is performed to remove the bonding layers B2 and thin down the insulating encapsulation 120 to form an insulating encapsulation 122 having reduced thickness. The thickness difference between the insulating encapsulation 120 and the insulating encapsulation 122 may be about 0.3 micrometer to about 2 micrometers. The thinning process is performed to remove the bonding layers B2 and a portion of the insulating encapsulation 120 until top surfaces of the bonding structures 116 are revealed. After performing the thinning process, the top surface S4 of the insulating encapsulation 122 is lower than the top surfaces S5 and S7 of the bonding structures 116.

In some embodiments, the thinning process includes an etching process for removal of the bonding layers B2 and removal of a portion of the insulating encapsulation 120, wherein an etchant utilized in the etching process may etch the bonding layers B2 at a first etching rate, the etchant utilized in the etching process may etch the first dielectric bonding films 116a of the bonding structures 116 at a second etching rate, and the etchant utilized in the etching process may etch the insulating encapsulation 120 at a third etching rate which is significantly greater than the first etching rate and the second etching rate. The removal amount of the insulating encapsulation 120 may be about 10 times to about 100 times to the removal amount of the bonding layers B2, and the removal amount of the insulating encapsulation 120 may be about 10 times to about 100 times to the removal amount of the first dielectric bonding films 116a. During the etching process, an etching amount of the bonding layers B2 is less than that of the insulating encapsulation 120 due to etching selectivity, and the insulating encapsulation 120 and the bonding layers B2 may be etched until the bonding layers B2 are etched-off. An the etching amount (i.e. etching depth) of the insulating encapsulation 120 illustrated in FIG. 3 may be greater than the thickness of the bonding layers B2, wherein the etching amount (i.e. etching depth) of the insulating encapsulation 120 may range from about 0.3 micrometer to about 2 micrometers, and the thickness of the bonding layers B2 may range from about 0.5 micrometer to about 1.5 micrometers.

During the etching process, the first dielectric bonding films 116a may be over-etched slightly after the bonding layers B2 are etched-off such that top surfaces S5 of the first dielectric bonding films 116a are slightly lower than top surfaces S7 of the first bonding conductors 116b. The etching amount (i.e. thickness loss) of the first dielectric bonding films 116a may range from about 0.05 micrometer to about 0.2 micrometers. Furthermore, the etching amount (i.e. etching depth) of the insulating encapsulation 120 may be 10 times to 100 times the etching amount (i.e. thickness loss) of the first dielectric bonding films 116a.

In some other embodiments, the thinning process includes a grinding process (e.g., A CMP process) following by an etching process, wherein the grinding process is performed to remove the bonding layers B2 and a portion of the insulating encapsulation 120 until the top surfaces of the bonding structures 116 are revealed, and the etching process is performed to remove another portion of the insulating encapsulation 120. After performing the grinding process, the top surfaces of the bonding structures 116 may be substantially leveled with a grinding surface of the insulating encapsulation 120. An etchant utilized in the etching process may etch the first dielectric bonding films 116a of the bonding structures 116 at a first etching rate, and the etchant utilized in the etching process may etch the insulating encapsulation 120 at a second etching rate which is significantly greater than the first etching rate. The removal amount of the insulating encapsulation 120 may be about 10 times to about 100 times to the removal amount of the bonding layers B2. During the etching process, an etching amount of the first dielectric bonding films 116a is significantly less than that of the insulating encapsulation 120 due to etching selectivity. An the etching amount (i.e. etching depth) of the insulating encapsulation 120 illustrated in FIG. 3 may be greater than the thickness of the bonding layers B2, wherein the etching amount (i.e. etching depth) of the insulating encapsulation 120 may range from about 0.3 micrometer to about 2 micrometers, and the thickness of the bonding layers B2 may range from about 0.5 micrometer to about 1.5 micrometers.

During the etching process, the first dielectric bonding films 116a may be over-etched slightly after the bonding layers B2 are polished-off such that top surfaces S5 of the first dielectric bonding films 116a are slightly lower than top surfaces S7 of the first bonding conductors 116b. The etching amount (i.e. thickness loss) of the first dielectric bonding films 116a may range from about 0.05 micrometer to about 0.2 micrometers. Furthermore, the etching amount (i.e. etching depth) of the insulating encapsulation 120 may be 10 times to 100 times the etching amount (i.e. thickness loss) of the first dielectric bonding films 116a.

In some alternative embodiments, the thinning process includes a grinding process (e.g., A CMP process) following by an etching process, wherein the grinding process is performed to remove top portions of the bonding layers B2 and a portion of the insulating encapsulation 120, and the etching process is performed to remove bottom portions of the bonding layers B2 and another portion of the insulating encapsulation 120. After performing the grinding process, the top surfaces of the bottom portions of the bonding layers B2 may be substantially leveled with a grinding surface of the insulating encapsulation 120. An etchant utilized in the etching process may etch the bonding layers B2 at a first etching rate, the etchant utilized in the etching process may etch the first dielectric bonding films 116a of the bonding structures 116 at a second etching rate, and the etchant utilized in the etching process may etch the insulating encapsulation 120 at a third etching rate which is significantly greater than the first etching rate and the second etching rate. The removal amount of the insulating encapsulation 120 may be about 10 times to about 100 times to the removal amount of the bonding layers B2, and the removal amount of the insulating encapsulation 120 may be about 10 times to about 100 times to the removal amount of the first dielectric bonding films 116a. During the etching process, an etching amount of the bonding layers B2 is less than that of the insulating encapsulation 120, and an etching amount of the first dielectric bonding films 116a is significantly less than that of the insulating encapsulation 120 due to etching selectivity. An the etching amount (i.e. etching depth) of the insulating encapsulation 120 illustrated in FIG. 3 may be greater than the thickness of the bonding layers B2, wherein the etching amount (i.e. etching depth) of the insulating encapsulation 120 may range from about 0.3 micrometer to about 2 micrometers, and the thickness of the bonding layers B2 may range from about 0.5 micrometer to about 1.5 micrometers.

During the etching process, the first dielectric bonding films 116a may be over-etched slightly after the bonding layers B2 are etched-off such that top surfaces S5 of the first dielectric bonding films 116a are slightly lower than top surfaces S7 of the first bonding conductors 116b. The etching amount (i.e. thickness loss) of the first dielectric bonding films 116a may range from about 0.05 micrometer to about 0.2 micrometers. Furthermore, the etching amount (i.e. etching depth) of the insulating encapsulation 120 may be 10 times to 100 times the etching amount (i.e. thickness loss) of the first dielectric bonding films 116a.

In some embodiments, the above-mentioned etching process include a single step etching process utilizing a single etchant. In some other embodiments, the above-mentioned etching process include a multi-step etching process utilizing various kinds of etchant.

Figure 5:
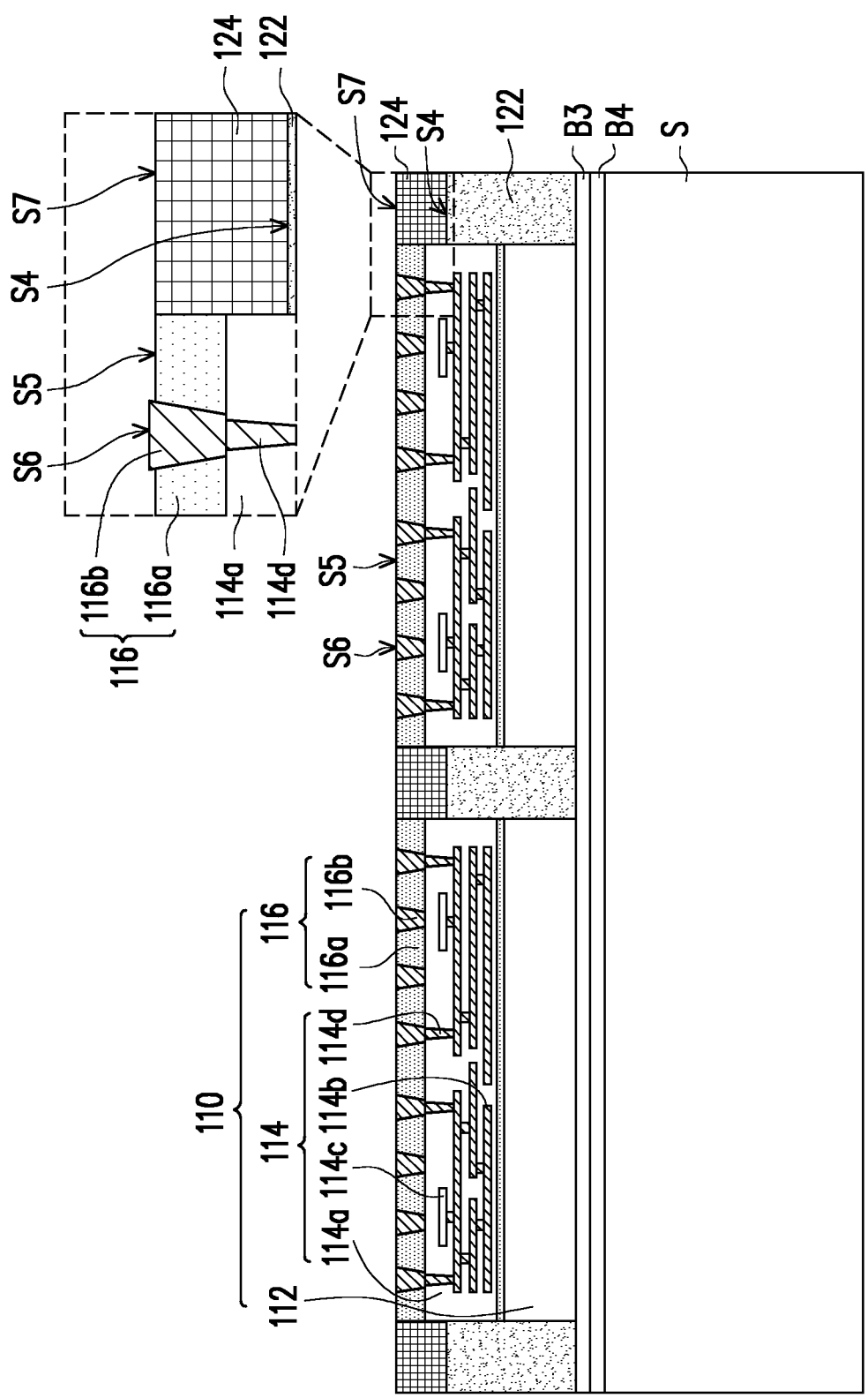

Referring to FIG. 5, after performing the thinning processes illustrated in FIG. 4, a bonding enhancement film 124 is formed on the top surface S4 of the insulating encapsulation 122, wherein the bonding enhancement film 124 is in contact with sidewalls of the bottom tier semiconductor dies 110, and a top surface S6 of the bonding enhancement film 124 is substantially leveled with the front surfaces of the bottom tier semiconductor dies 110. As illustrated in FIG. 5, first portions (i.e. lower portions) of the bottom tier semiconductor dies 110 may be laterally encapsulated by the insulating encapsulation 122, and second portions (i.e. upper portions) of the bottom tier semiconductor dies 110 may be laterally encapsulated by the bonding enhancement film 124. In some embodiments, the top surfaces S5 of the first dielectric bonding films 116a are substantially leveled with the top surface S6 of the bonding enhancement film 124, and the top surfaces S7 of the first bonding conductors 116b are slightly higher than the top surface S6 of the bonding enhancement film 124.

The bonding enhancement film 124 may be formed by a deposition process followed by a removal process. The material of the bonding enhancement film 124 may be different from that of the insulating encapsulation 120. In some embodiments, an insulating material, such as silicon oxide or silicon oxynitride, is formed on the insulating encapsulation 122 to cover front surfaces and sidewalls of the bottom tier semiconductor dies 110 through a chemical vapor deposition (CVD) process, and a chemical mechanical polishing (CMP) process or other suitable removal process is then performed to remove portions of the insulating material until the front surfaces of the bottom tier semiconductor dies 110 are revealed. After performing the above-mentioned removal process, the bonding enhancement film 124 is formed to fill gaps between the bottom tier semiconductor dies 110 such that the top surface S6 of the bonding enhancement film 124 may be substantially leveled with the front surfaces of the bottom tier semiconductor dies 110. Furthermore, the total thickness of the bonding enhancement film 124 and the insulating encapsulation 122 may be substantially equal to the thickness of the bottom tier semiconductor dies 110.

Figure 6:
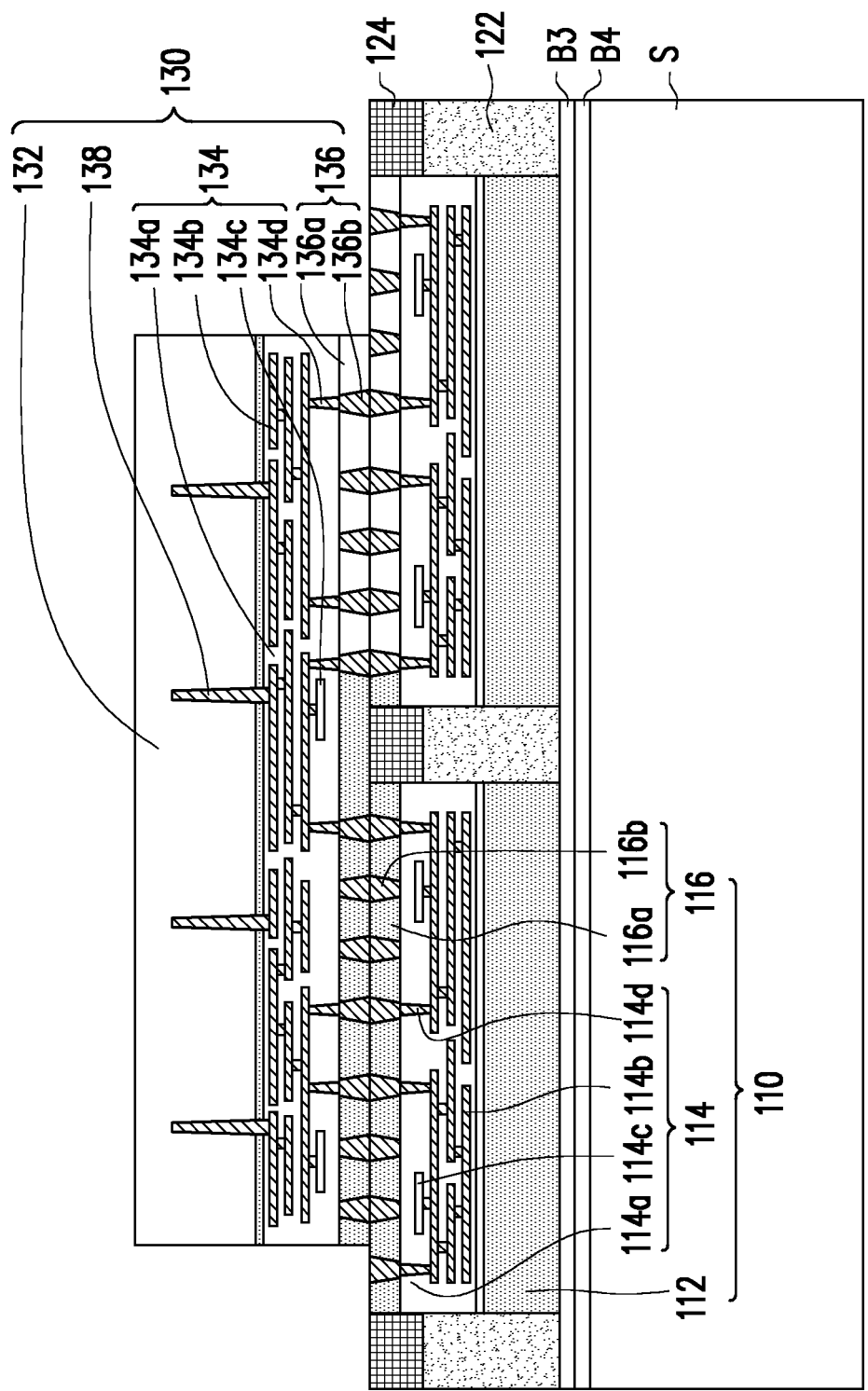

Referring to FIG. 5 and FIG. 6, at least one top tier semiconductor die 130 is provided and flipped onto the resulted structure illustrated in FIG. 5. The top tier semiconductor die 130 may be bonded to the bottom tier semiconductor dies 110 and the bonding enhancement film 124. A chip-to-wafer hybrid bonding process may be performed to bond the top tier semiconductor die 130 with the bottom tier semiconductor dies 110 and the bonding enhancement film 124.

The top tier semiconductor die 130 may each include a semiconductor substrate 132, an interconnect structure 134 disposed on the semiconductor substrate 132 and a bonding structure 136 disposed on the interconnect structure 134. The top tier semiconductor die 130 may further include through semiconductor vias (TSVs) 138 embedded in the semiconductor substrate 132, wherein the TSVs 138 are electrically connected to the interconnect structure 134, and the TSVs 138 are not revealed from the back surface of the semiconductor substrate 132 at this stage. The semiconductor substrate 132 may be a silicon substrate including active components (e.g., transistors or the like) and passive components (e.g., resistors, capacitors, inductors, or the like) formed therein. The active components and passive components are formed in the semiconductor substrate 132 through front end of line (FEOL) fabrication processes of the top tier semiconductor die 130. The interconnect structure 134 may include dielectric layers 134a, interconnect wirings (e.g., copper interconnect wirings) 134b, conductive pads 134c (e.g., aluminum pads) and conductive vias 134d, wherein the interconnect wirings 134b, the conductive pads 134c and the conductive vias 134d are embedded in the dielectric layers 134a, and the interconnect wirings 134b, the conductive pads 134c and the conductive vias 134d are electrically connected to the active components and/or the passive components in the semiconductor substrate 132.

The interconnect structure 134 is formed through back end of line (BEOL) fabrication processes of the top tier semiconductor die 130. The interconnect structure 134 may further include a passivation layer (not shown), wherein the conductive pads 134c are partially covered by the passivation layer. In other words, the conductive pads 134c are partially revealed from the openings defined in the passivation layer. The passivation layer may be a silicon oxide layer, a silicon nitride layer, a silicon oxy-nitride layer, or a dielectric layer formed by other suitable inorganic dielectric materials. The interconnect structure 134 may further include a post-passivation layer (not shown) formed over the passivation layer, wherein the post-passivation layer covers the passivation layer and the conductive pads 134c, the post-passivation layer includes a plurality of contact openings, and the conductive pads 134c are partially revealed from the contact openings defined in the post passivation layer. The post-passivation layer may be a polyimide (PI) layer, a PBO layer, or a dielectric layer formed by other suitable organic dielectric materials. In some alternative embodiments, the post-passivation layer is omitted.

The bonding structure 136 disposed on the interconnect structure 134 may include a second dielectric bonding film 136a and second bonding conductors 136b embedded in the second dielectric bonding film 136a, wherein the second dielectric bonding film 136a covers the interconnect structure 134, and the second bonding conductors 136b are electrically connected to the interconnect wirings 134b through the conductive vias 134d. The material of the second dielectric bonding film 136a may include silicon oxide, silicon oxynitride or other suitable dielectric materials, and the material of the second bonding conductors 136b may include copper or other suitable metallic materials. The material of the second dielectric bonding film 136a may be the same as that of the first dielectric bonding film 116a, and the material of the second bonding conductors 136b may be the same as that of the first bonding conductors 116b.

After performing the above-mentioned chip-to-wafer hybrid bonding process, the bonding structure 136 of the top tier semiconductor die 130 is bonded with the bonding structures 116 of the bottom tier semiconductor dies 110 and the bonding enhancement film 124. As illustrated in FIG. 6, the second bonding conductors 136b are bonded with and electrically connected to the first bonding conductors 116b, the second dielectric bonding film 136a are bonded with the first dielectric bonding film 116a and a portion of the bonding enhancement film 124. When performing the above-mentioned chip-to-wafer hybrid bonding process, since both of the bonding enhancement film 124 and the first dielectric bonding film 116a are capable of bonding with the second dielectric bonding film 136a of the top tier semiconductor die 130, the top tier semiconductor die 130 can be placed on and bonded with regions of the reconstructed wafer structure arbitrarily as long as the second bonding conductors 136b can bond with and electrically connected to the first bonding conductors 116b. Accordingly, dimension of the top tier semiconductor die 130 may not be limited to be smaller than that of the bottom tier semiconductor dies 110.

Figure 7:
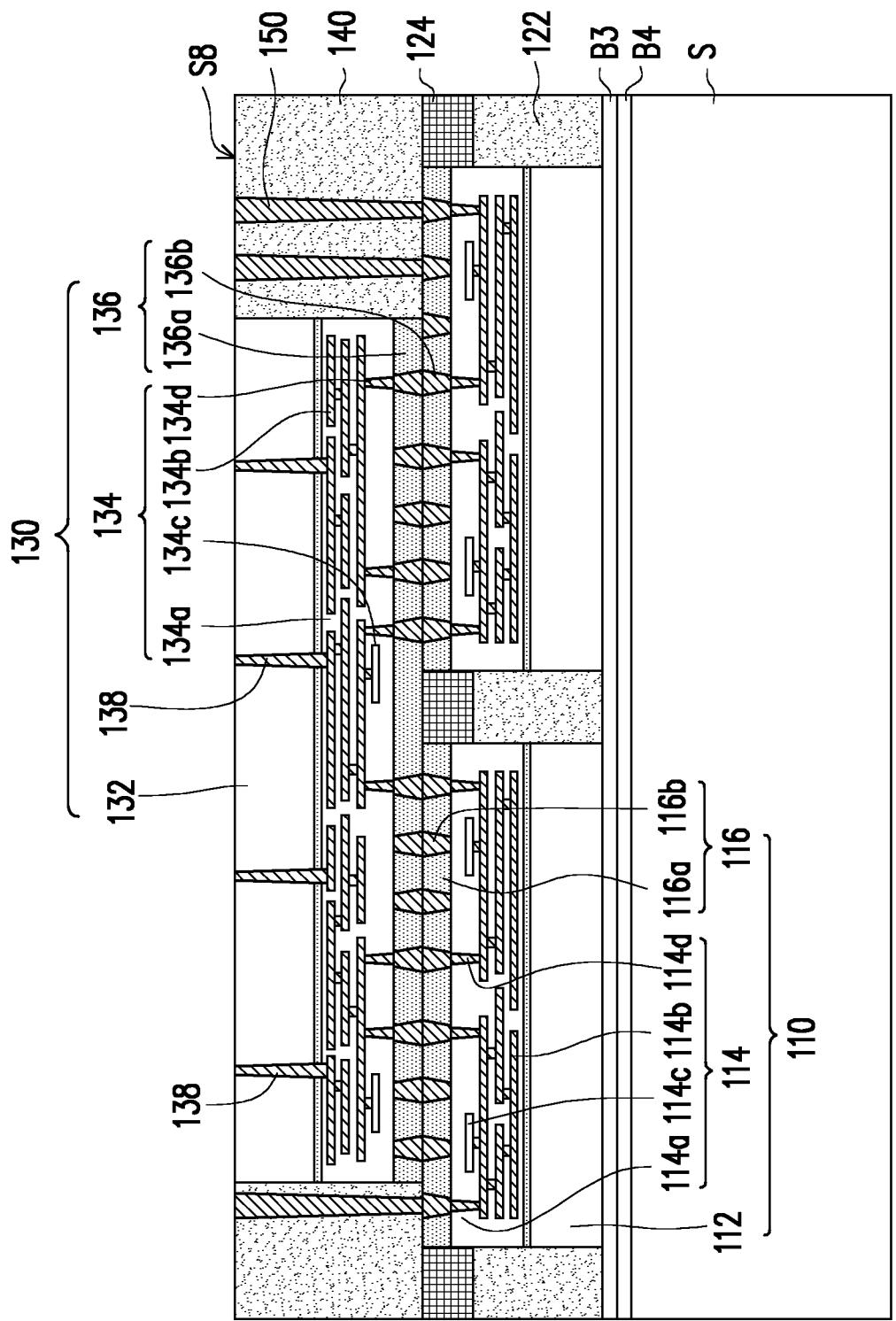

Referring to FIG. 7, an insulating encapsulation 140 is formed over the bottom tier semiconductor dies 110 and the bonding enhancement film 124 to laterally encapsulate the top tier semiconductor die 130. The insulating encapsulation 140 may be formed by an over-molding process or a deposition process followed by a removal process. In some embodiments, an insulating material such as tetraethoxysilane (TEOS) formed oxide is formed on the bottom tier semiconductor dies 110 and the bonding enhancement film 124 to cover a back surface and sidewalls of the top tier semiconductor die 130 through a chemical vapor deposition (CVD) process, and a chemical mechanical polishing (CMP) process or other suitable removal process is then performed to remove portions of the TEOS formed oxide until the back surface of the top tier semiconductor die 130 and the TSVs 138 are revealed. In some alternative embodiments, an insulating material such as epoxy resin is formed on the bottom tier semiconductor dies 110 and the bonding enhancement film 124 to cover a back surface and sidewalls of the top tier semiconductor die 130 through an over-molding process, and a chemical mechanical polishing (CMP) process or other suitable removal process is then performed to remove portions of the epoxy resin until the back surface of the top tier semiconductor die 130 and the TSVs 138 are revealed. After performing the above-mentioned removal process, the insulating encapsulation 140 is formed to laterally encapsulate the top tier semiconductor die 130, and a surface S8 of the insulating encapsulation 140 is substantially leveled with the back surface of the top tier semiconductor die 130.

After forming the insulating encapsulation 140, through insulator vias (TIVs) 150 laterally encapsulated by the insulating encapsulation 140 are formed in the insulating encapsulation 140. The TIVs 150 penetrate through the insulating encapsulation 140 and are electrically connected to portions of the first bonding conductors 116b. In some embodiments, a patterning process is performed to form through holes in the insulating encapsulation 140 such that portions of the first bonding conductors 116b are revealed by the through holes; a deposition process is performed to form a conductive material (e.g., copper) over the top surface of the insulating encapsulation 140 and the back surface of the top tier semiconductor die 130, wherein the through holes are filled by the conductive material; and a removal process is performed to remove a portion of the conductive material covering the top surface of the insulating encapsulation 140 and the back surface of the top tier semiconductor die 130 such that the TIVs 150 embedded in the insulating encapsulation 140 are formed. The above-mentioned patterning process may be a laser drilling process, a lithography process followed by an etching process or other suitable patterning process. The above-mentioned removal process for removing the conductive material may be an etching process, a grinding process (e.g. CMP process), combinations thereof or other suitable removal process.

Figure 8:
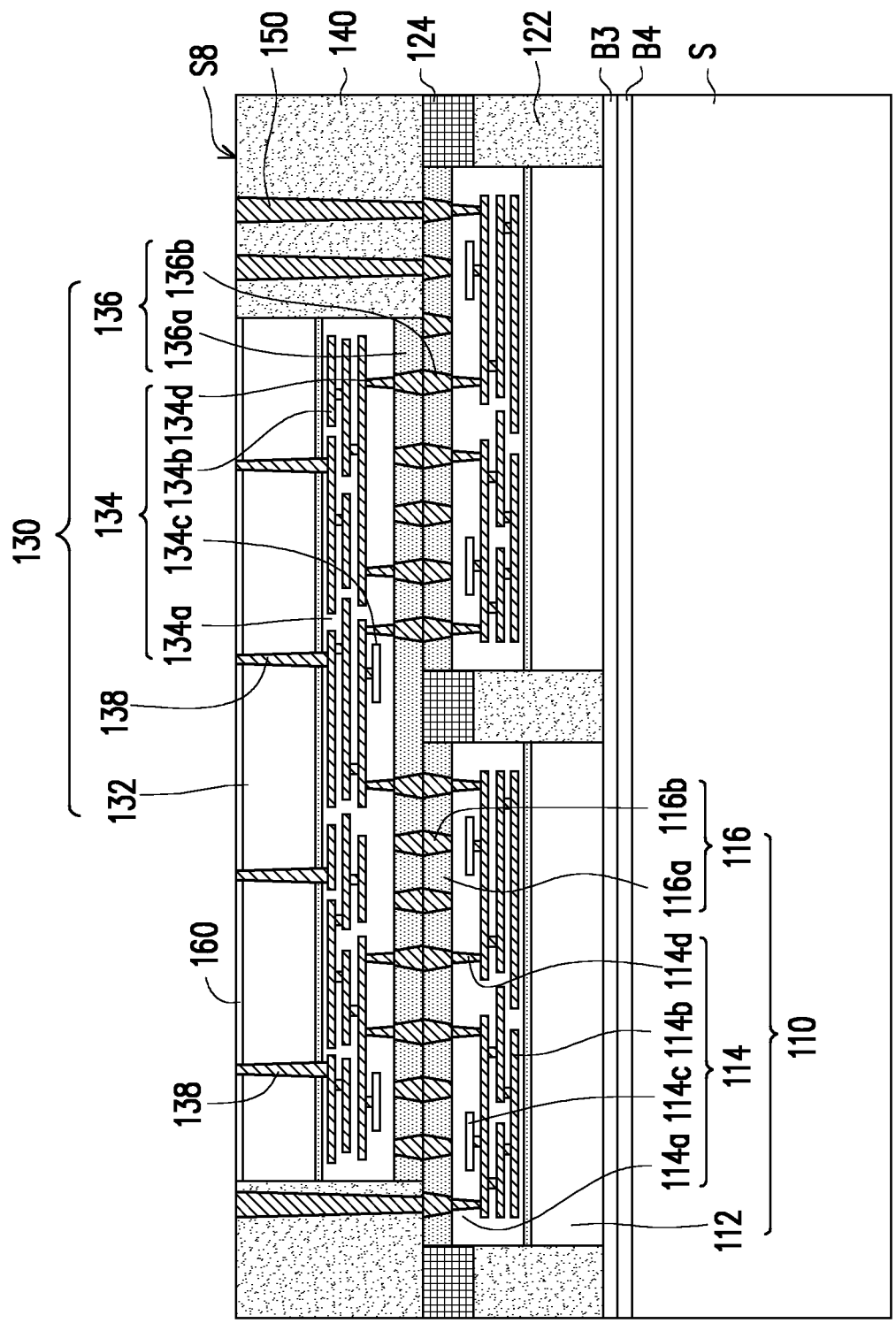

Referring to FIG. 8, a removal process may be performed to remove a portion of the semiconductor substrate 132 of the top tier semiconductor die 130 such that the TSVs 138 protrude from the semiconductor substrate 132. The above-mentioned removal process may be an etching process or other suitable removal process. In some embodiments, a dielectric material is formed to cover the semiconductor substrate 132, the TSVs 138, the TIVs 150 and the insulating encapsulation 140; and a planarization process is performed to remove a portion of the dielectric material until the TSVs 138 are revealed such that a dielectric layer 160 is formed, and the top surface of the dielectric layer 160 is substantially leveled with the top surface of the in planarize insulating encapsulation 140. The above-mentioned planarization process for partially removing the dielectric material may be an etching process, a grinding process or other suitable process.

Figure 9:
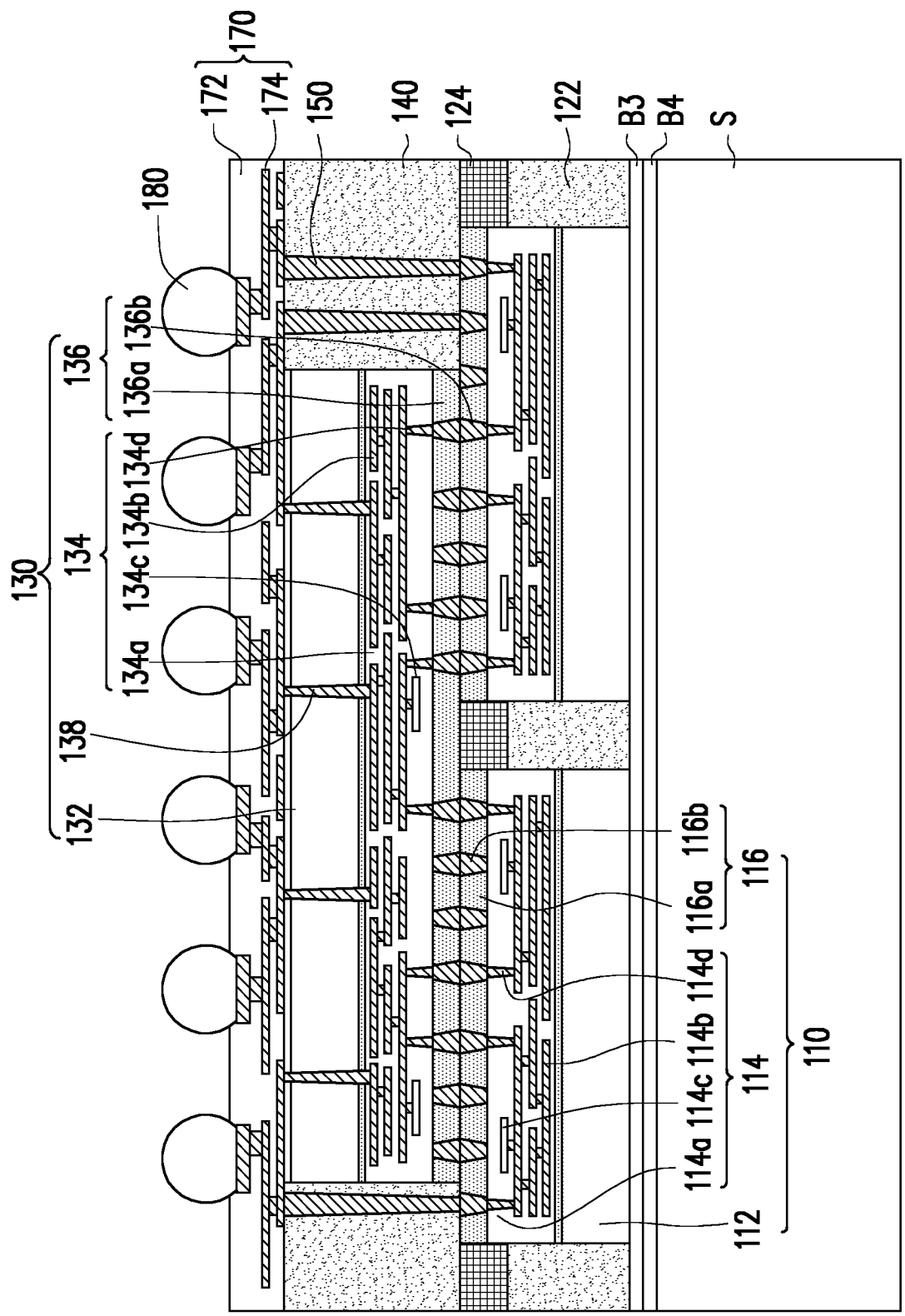

Referring to FIG. 9, a redistribution circuit structure 170 and conductive terminals 180 are formed over the top tier semiconductor die 130, the TIV 150 and the insulating encapsulation 140. The redistribution circuit structure 170 may include stacked dielectric layers 172 and redistribution wirings 174 embedded in the stacked dielectric layers 172. The redistribution wirings 174 may be electrically connected to the TIV 150 and the TSVs 138 of the top tier semiconductor die 130. The conductive terminals 180 may be disposed on the and electrically connected to the redistribution circuit structure 170. In some embodiments, the conductive terminals 180 includes conductive bumps arranged in array.

As illustrated in FIG. 9, a package structure including at least one first semiconductor die 110, a first insulating encapsulation 122, a bonding enhancement film 124, a second semiconductor die 130 and a second insulating encapsulation 140 is provided. Two first semiconductor dies 110 are shown for illustration and the number of the first semiconductor dies is not limited in the present application. The first insulating encapsulation 122 laterally encapsulates first portions (e.g., bottom portions) of the first semiconductor dies 110. The bonding enhancement film 124 is disposed on a top surface S4 of the first insulating encapsulation 122 and laterally encapsulates second portions (e.g., upper portions) of the first semiconductor dies 110, wherein a top surface S6 of the bonding enhancement film 124 is substantially leveled with top surfaces S5 and S6 of the semiconductor dies 110, and a thickness of the first dielectric bonding film 116a is less than a thickness of the bonding enhancement film 124. The second semiconductor die 130 is disposed on and bonded to the first semiconductor dies 110 and the bonding enhancement film 124. The second insulating encapsulation 140 laterally encapsulates the second semiconductor die 130. In some embodiments, a material of the first insulating encapsulation 122 is different from that of the bonding enhancement film 124. In some embodiments, the top surface S4 of the first insulating encapsulation 122 is lower than the top surfaces S5 and S6 of the first semiconductor dies 110.

In some embodiments, the package structure further includes first through insulating vias (TIVs) 150 and a redistribution circuit structure 170, wherein the first TIVs 150 are disposed aside the second semiconductor die 130, the first TIVs 150 penetrates through the second insulating encapsulation 140, the redistribution circuit structure 170 is disposed on the second semiconductor die 130 and the second insulating encapsulation 140, and the redistribution circuit structure 170 is electrically connected to the first semiconductor dies 110 through the first TIVs 150. In some embodiments, the package structure further includes a support substrate S disposed on a bottom surface S1 of the first insulating encapsulation 120, wherein the bottom surface S1 of the first insulating encapsulation 120 is opposite to the top surface S2 of the first insulating encapsulation 120.

FIG. 10 through FIG. 14 are various cross-sectional views schematically illustrating integrated fanout package structures in accordance with other embodiments of the present disclosure.

Figure 10:
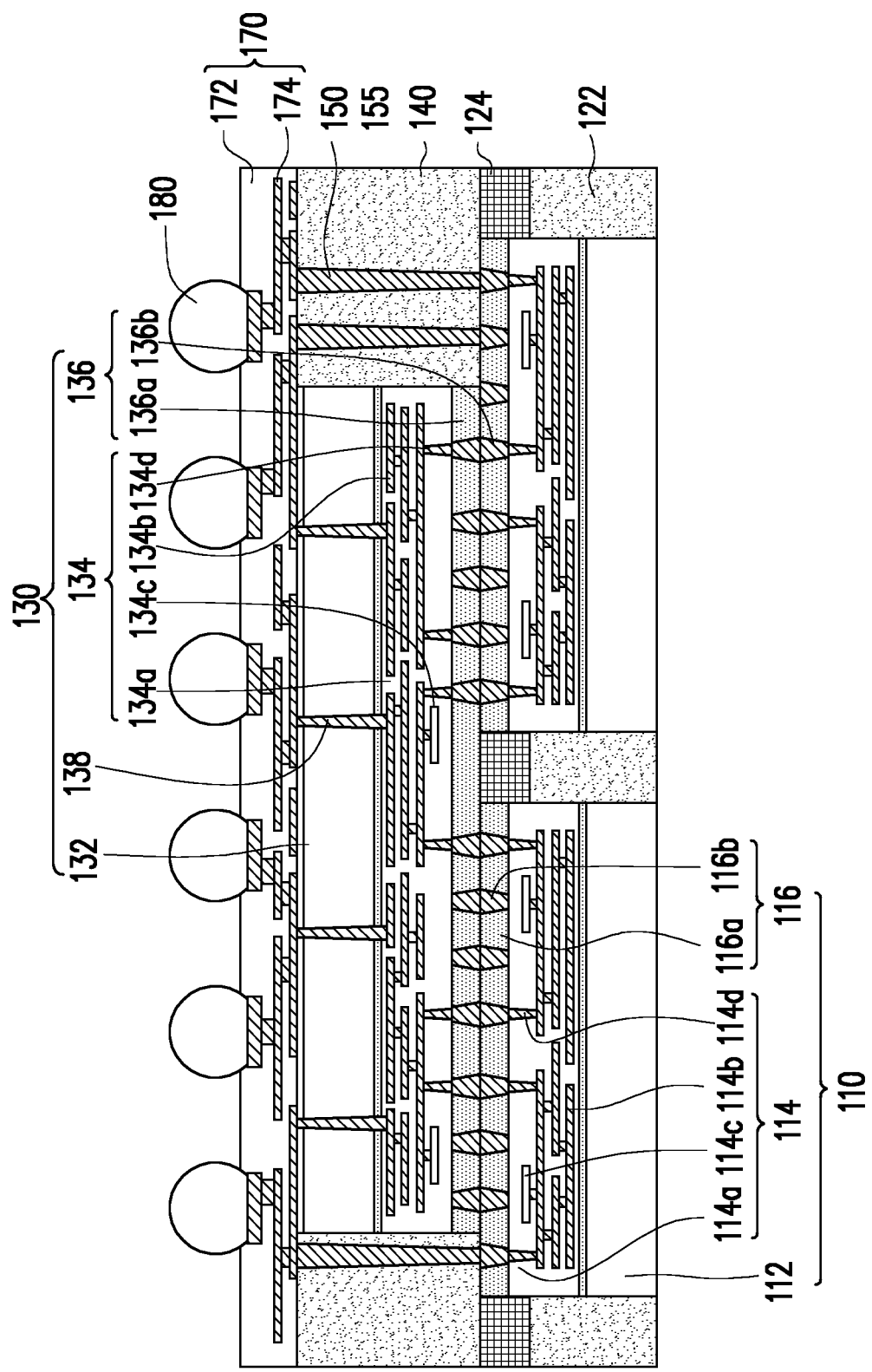
FIG. 10 through FIG. 14 are various cross-sectional views schematically illustrating integrated fanout package structures in accordance with other embodiments of the present disclosure.

Referring to FIG. 9 and FIG. 10, a package structure illustrated in FIG. 10 is similar to the package illustrated in FIG. 9 except that the package structure illustrated in FIG. 10 does not include the support substrate S, the bonding layer B3 and the bonding layer B4 illustrated in FIG. 9. The back surfaces of the first semiconductor dies 110 are revealed from the bottom surface S1 of the first insulating encapsulation 120.

Figure 11:
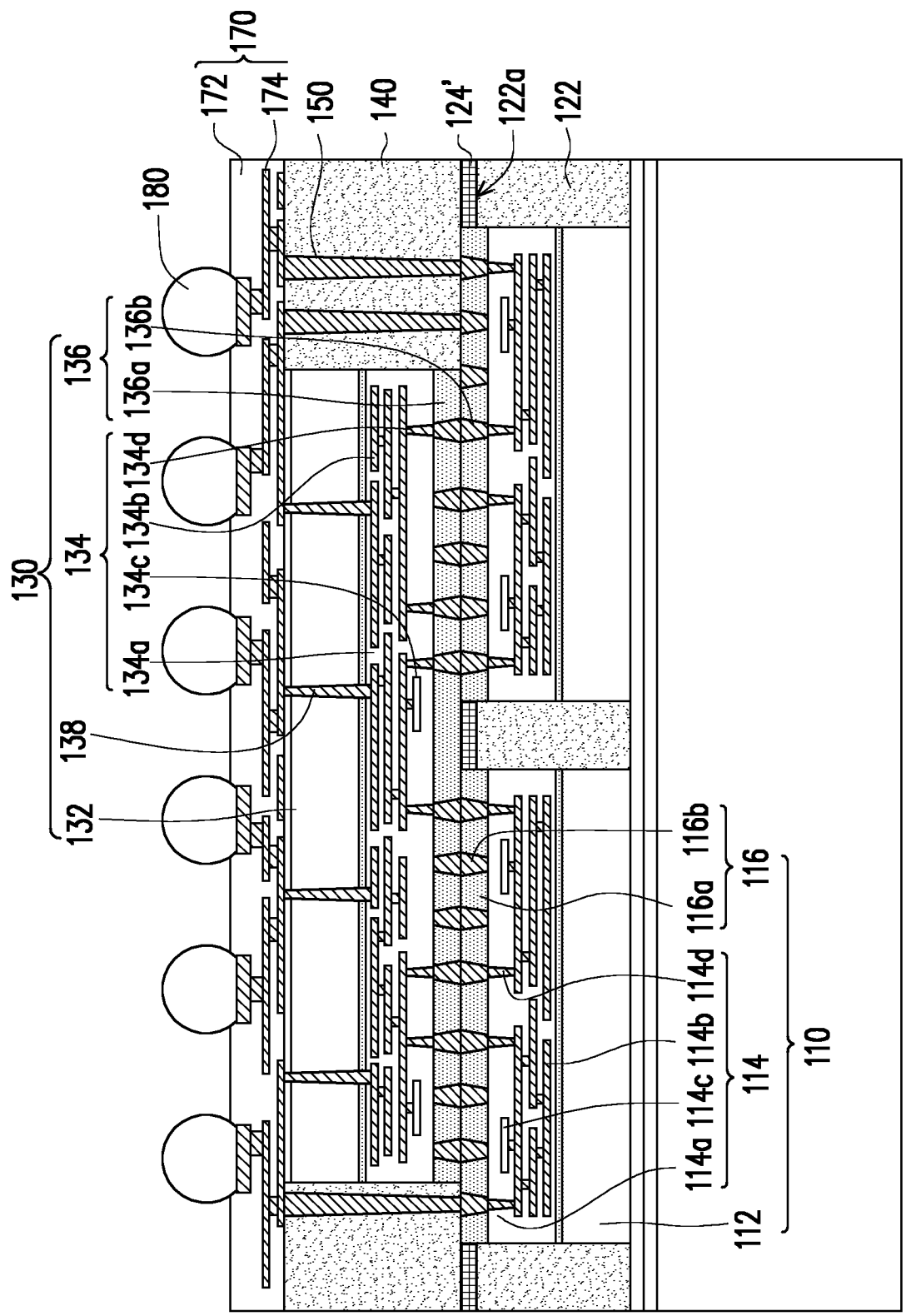

Referring to FIG. 9 and FIG. 11, a package structure illustrated in FIG. 11 is similar to the package illustrated in FIG. 9 except that a thickness of the first dielectric bonding film 116a is greater than a thickness of the bonding enhancement film 124'. In some other embodiments, a thickness of the first dielectric bonding film 116a is substantially equal to a thickness of the bonding enhancement film 124'.

Figure 12:
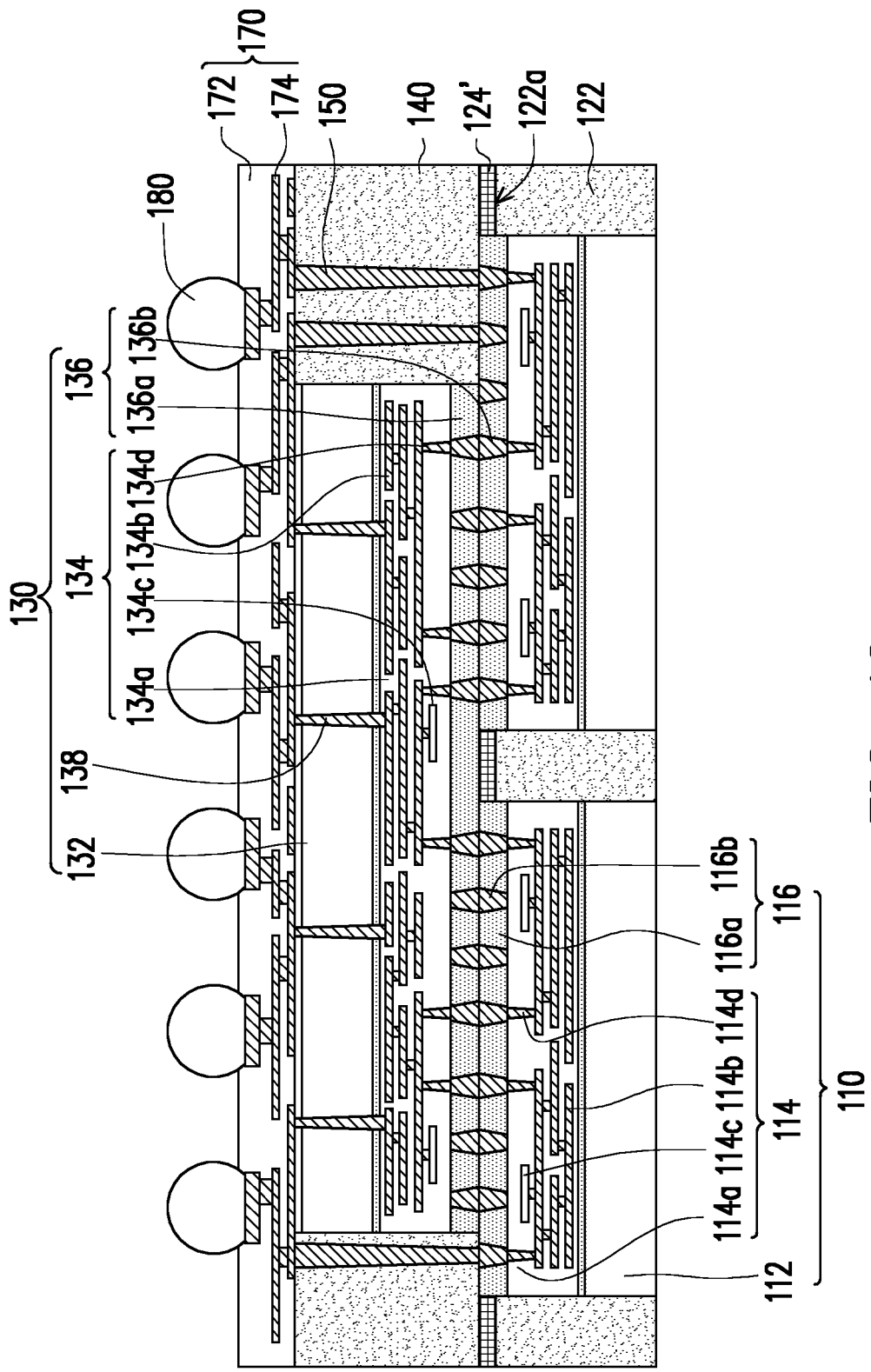

Referring to FIG. 11 and FIG. 12, a package structure illustrated in FIG. 12 is similar to the package illustrated in FIG. 11 except that the package structure illustrated in FIG. 12 does not include the support substrate S, the bonding layer B3 and the bonding layer B4 illustrated in FIG. 11. The back surfaces of the first semiconductor dies 110 are revealed from the bottom surface S1 of the first insulating encapsulation 120. In some other embodiments, a thickness of the first dielectric bonding film 116a is substantially equal to a thickness of the bonding enhancement film 124'.

Figure 13:
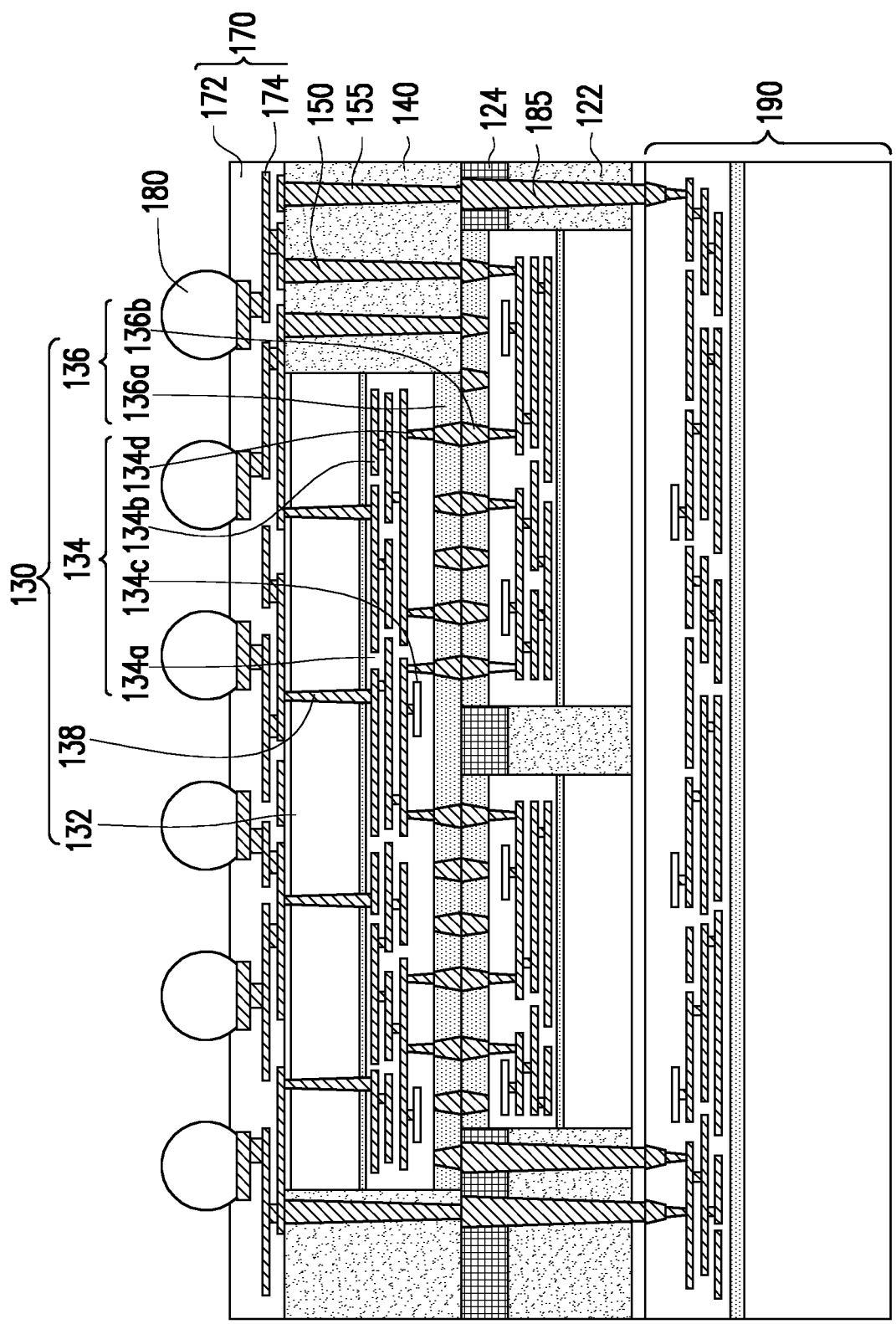

Referring to FIG. 9 and FIG. 13, a package structure illustrated in FIG. 13 is similar to the package illustrated in FIG. 9 except that the package structure illustrated in FIG. 13 does not include the support substrate S, the bonding layer B3 and the bonding layer B4 illustrated in FIG. 9, and the package structure illustrated in FIG. 13 further includes a semiconductor wafer 190, at least one TIV 155 and at least one TIV 185. The TIV 155 is disposed aside of the second semiconductor die 130 and laterally encapsulated by the second insulating encapsulation 140. The TIV 185 is disposed aside of the first semiconductor dies 130 and laterally encapsulated by the first insulating encapsulation 122 and the bonding enhancement film 124. The redistribution circuit structure 170 may be electrically connected to the semiconductor wafer 190 through the TIV 155 and the TIV 185.

Figure 14:
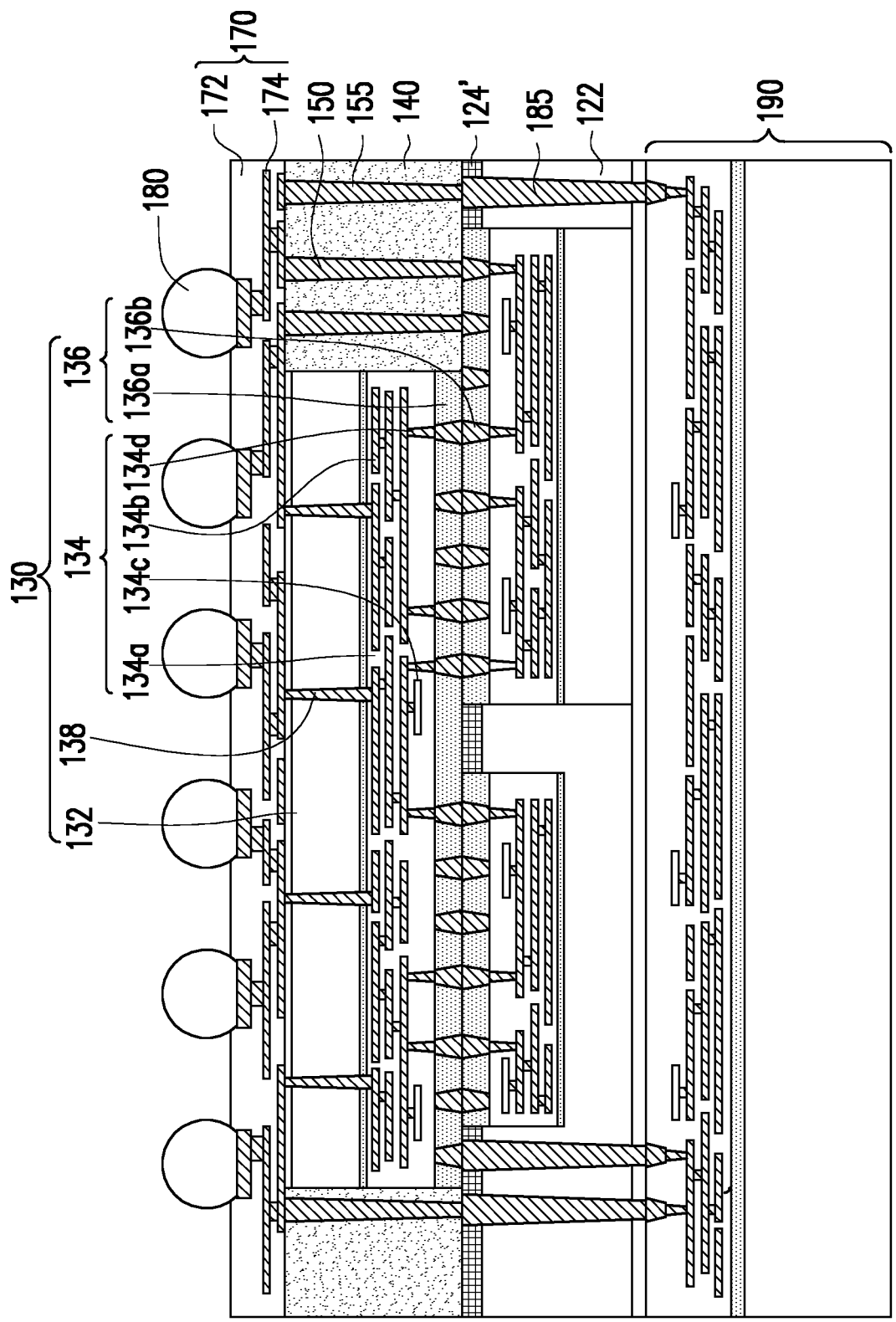

Referring to FIG. 13 and FIG. 14, a package structure illustrated in FIG. 14 is similar to the package illustrated in FIG. 3 except that a thickness of the first dielectric bonding film 116*a* is greater than a thickness of the bonding enhancement film 124'. In some other embodiments, a thickness of the first dielectric bonding film 116*a* is substantially equal to a thickness of the bonding enhancement film 124'.

In the above-mentioned embodiments, since the bonding structure 160 and the bonding enhancement film 124 or 124' provides a continuous bonding interface for the top tier semiconductor die 130, the process window of the bonding between the top tier semiconductor die 130 and the bottom tier semiconductor dies 110 may be enlarged.

In accordance with some embodiments of the disclosure, a package structure including a first semiconductor die, a first insulating encapsulation, a bonding enhancement film, a second semiconductor die and a second insulating encapsulation is provided. The first insulating encapsulation laterally encapsulates a first portion of the first semiconductor die. The bonding enhancement film is disposed on a top surface of the first insulating encapsulation and laterally encapsulates a second portion of the first semiconductor die, wherein a top surface of the bonding enhancement film is substantially leveled with a top surface of the semiconductor die. The second semiconductor die is disposed on and bonded to the first semiconductor die and the bonding enhancement film. The second insulating encapsulation laterally encapsulates the second semiconductor die. In some embodiments, a material of the first insulating encapsulation is different from that of the bonding enhancement film. In some embodiments, the top surface of the first insulating encapsulation is lower than the top surface of the first semiconductor die. In some embodiments, the package structure further includes a first through insulating via (TIV) and a redistribution circuit structure, wherein the first through insulating via (TIV) is disposed aside the second semiconductor die, the first TIV penetrates through the second insulating encapsulation, the redistribution circuit structure is disposed on the second semiconductor die and the second insulating encapsulation, and the redistribution circuit structure is electrically connected to the first semiconductor die through the first TIV. In some embodiments, the package structure further includes a support substrate disposed on a bottom surface of the first insulating encapsulation, wherein the bottom surface of the first insulating encapsulation is opposite to the top surface of the first insulating encapsulation. In some embodiments, the package structure further includes a second TIV disposed aside the first semiconductor die, wherein the second TIV penetrates through the first insulating encapsulation and is electrically connected to the support substrate and the first TIV.

In accordance with some other embodiments of the disclosure, a package structure including a first semiconductor die, a first insulating encapsulation, a bonding enhancement film, a second semiconductor die and a second insulating encapsulation is provided. The first semiconductor die includes a first bonding structure, wherein the first bonding structure comprises a first dielectric bonding film and first bonding conductors embedded in the first dielectric bonding film. The first insulating encapsulation laterally encapsulates the first semiconductor die. The bonding enhancement film is disposed on a first side of the first insulating encapsulation and laterally encapsulating the first semiconductor die, wherein a total thickness of the bonding enhancement film and the first insulating encapsulation is substantially equal to a thickness of the first semiconductor die. The second semiconductor die is stacked on and electrically connected to the first semiconductor die, the second semiconductor die comprising a second bonding structure, the second bonding structure includes a second dielectric bonding film and second bonding conductors embedded in the second dielectric bonding film, wherein the first bonding conductors are bonded to the second bonding conductors, the second dielectric bonding film is bonded to the first dielectric bonding film and the bonding enhancement film. The second insulating encapsulation laterally encapsulates the second semiconductor die. In some embodiments, a material of the first insulating encapsulation is different from that of the first dielectric bonding film, and the material of the first insulating encapsulation is different from that of the bonding enhancement film. In some embodiments, a thickness of the first dielectric bonding film is different from a thickness of the bonding enhancement film. In some embodiments, a thickness of the first bonding film is the same as a thickness of the bonding enhancement film. In some embodiments, the package structure further includes a first through insulating via (TIV) and a redistribution circuit structure. The first through insulating via (TIV) are disposed aside the second semiconductor die, and the first TIV penetrates through the second insulating encapsulation. The redistribution circuit structure is disposed on the second semiconductor die and the second insulating encapsulation, and the redistribution circuit structure is electrically connected to the first semiconductor die through the first TIV. In some embodiments, the package structure further includes a support substrate located on a second side of the first insulating encapsulation, wherein the second side of the first insulating encapsulation is opposite to the first side of the first insulating encapsulation. In some embodiments, the package structure further includes a second TIV disposed aside the first semiconductor die, wherein the second TIV penetrates through the first insulating encapsulation and is electrically connected to the support substrate, the second semiconductor die and the first TIV.

In accordance with some other embodiments of the disclosure, a method including the followings is provided. A first semiconductor die including a first bonding structure is provided. The first semiconductor die is laterally encapsulated with a first insulating encapsulation. The first insulating encapsulation is thinned down such that a top surface of the first insulating encapsulation is lower than a top surface of the first bonding structure. A bonding enhancement film is formed on the top surface of the first insulating encapsulation, wherein a top surface of the bonding enhancement film is substantially leveled with the top surface of the first bonding structure. A second bonding structure of a second semiconductor die is bonded to the first semiconductor die and the bonding enhancement film. The second semiconductor die is laterally encapsulated with a second insulating encapsulation. In some embodiments, the first insulating encapsulation is thinned through at least an etching process. In some embodiments, the first bonding structure includes a first dielectric bonding film and first bonding conductors embedded in the first dielectric bonding film, and a thickness loss of the first dielectric bonding film is caused by the etching process. In some embodiments, the method further includes attaching the first semiconductor die and the first insulating encapsulation to a support substrate before thinning the first insulating encapsulation. In some embodiments, the first semiconductor die and the first insulating encapsulation are attached to the support substrate through a fusion bonding process. In some embodiments, the method further includes forming a first TIV in the second insulating encapsulation after laterally encapsulating the second semiconductor die with the second insulating encapsulation; and forming a redistribution circuit structure on the second semiconductor die and the second insulating encapsulation. In some embodiments, the method further includes forming a second TIV in the first insulating encapsulation, wherein the second TIV is electrically connected to the support substrate and the first TIV.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a first semiconductor die;
   a first insulating encapsulation laterally encapsulating a lower portion of the first semiconductor die;
   a bonding film disposed on the first insulating encapsulation and laterally encapsulating an upper portion of the first semiconductor die, wherein a lower portion of a sidewall surface of the first semiconductor die is in direct contact with the first insulating encapsulation, and an upper portion of the sidewall surface of the first semiconductor die is in direct contact with the bonding film;
   a second semiconductor die disposed on the first semiconductor die and the bonding film; and
   a second insulating encapsulation laterally encapsulating the second semiconductor die, wherein sidewalls of the first insulating encapsulation are substantially aligned with sidewalls of the second insulating encapsulation and sidewalls of the bonding film.

2. The package structure of claim 1, wherein the second semiconductor die covers and is in contact with a first portion of the bonding film.

3. The package structure of claim 1, wherein the second semiconductor die covers and is in contact with the upper portion of the first semiconductor die.

4. The package structure of claim 1 further comprising:
   a first through insulating via (TIV) disposed aside the second semiconductor die, wherein the first TIV penetrates through the second insulating encapsulation; and
   a redistribution circuit structure disposed on the second semiconductor die, the first TIV and the second insulating encapsulation, wherein the redistribution circuit structure is electrically connected to the first semiconductor die through the first TIV.

5. The package structure of claim 4 further comprising:
   a support substrate connected to the first insulating encapsulation and the lower portion of the first semiconductor die through at least one bonding layer.

6. The package structure of claim 5, further comprising:
   a second TIV disposed aside the first semiconductor die, wherein the second TIV penetrates through the first insulating encapsulation and is electrically connected to the support substrate and the first TIV.

7. A package structure, comprising:
   a first semiconductor die comprising a first bonding structure, wherein the first bonding structure comprises a first dielectric bonding film and first bonding conductors embedded in the first dielectric bonding film;
   a first insulating encapsulation laterally encapsulating the first semiconductor die;
   a bonding film disposed on a first side of the first insulating encapsulation and laterally encapsulating the first semiconductor die;
   a second semiconductor die disposed on the first semiconductor die and the bonding film, the second semiconductor die comprising a second bonding structure, the second bonding structure comprising a second dielectric bonding film and second bonding conductors embedded in the second dielectric bonding film, wherein the first bonding conductors are bonded to the second bonding conductors, the second dielectric bonding film is bonded to the first dielectric bonding film and the bonding film; and
   a second insulating encapsulation laterally encapsulating the second semiconductor die, wherein a bottom surface of the second insulating encapsulation substantially levels with a top surface of the first semiconductor die.

8. The package structure of claim 7, wherein a material of the first insulating encapsulation is different from that of the first dielectric bonding film, and the material of the first insulating encapsulation is different from that of the bonding film.

9. The package structure of claim 7, wherein a thickness of the first dielectric bonding film is different from a thickness of the bonding film.

10. The package structure of claim 7, wherein a thickness of the first dielectric bonding film is the same as a thickness of the bonding film.

11. The package structure of claim 7 further comprising:
    a first through insulating via (TIV) disposed aside the second semiconductor die, wherein the first TIV penetrates through the second insulating encapsulation; and
    a redistribution circuit structure disposed on the second semiconductor die and the second insulating encapsulation, wherein the redistribution circuit structure is electrically connected to the first semiconductor die through the first TIV.

12. The package structure of claim 11 further comprising:
    a support substrate located on a second side of the first insulating encapsulation, wherein the second side of the first insulating encapsulation is opposite to the first side of the first insulating encapsulation.

13. The package structure of claim 12 further comprising:
    a second TIV disposed aside the first semiconductor die, wherein the second TIV penetrates through the first insulating encapsulation and is electrically connected to the support substrate, the second semiconductor die and the first TIV.

14. A package structure, comprising:
    a first semiconductor die;
    a first insulating encapsulation laterally encapsulating a first portion of the first semiconductor die;
    a bonding film disposed on a top surface of the first insulating encapsulation and laterally encapsulating a second portion of the first semiconductor die;
    a second semiconductor die disposed on the first semiconductor die and the bonding film;

second insulating encapsulation laterally encapsulating the second semiconductor die, wherein the first insulating encapsulation is spaced apart from the second semiconductor die by the bonding film; and a first through insulating via (TIV) disposed aside the second semiconductor die, wherein the first TIV penetrates through the second insulating encapsulation.

15. The package structure of claim 14, wherein sidewalls of the first insulating encapsulation are substantially aligned with sidewalls of the bonding film.

16. The package structure of claim 14, wherein a material of the first insulating encapsulation is different from a material of the bonding film.

17. The package structure of claim 16 further comprising:

a redistribution circuit structure disposed on the second semiconductor die and the second insulating encapsulation, wherein the redistribution circuit structure is electrically connected to the first semiconductor die through the first TIV.

18. The package structure of claim 17 further comprising:

a support substrate disposed on a bottom surface of the first insulating encapsulation, wherein the bottom surface of the first insulating encapsulation is opposite to the top surface of the first insulating encapsulation.

19. The package structure of claim 18, further comprising:

a second TIV disposed aside the first semiconductor die, wherein the second TIV penetrates through the first insulating encapsulation and is electrically connected to the support substrate and the first TIV.

20. The package structure of claim 14, wherein the bonding film is in contact with the first insulating encapsulation and the second insulating encapsulation, and the first insulating encapsulation is spaced apart from the second insulating encapsulation by the bonding film.

* * * * *